(12) United States Patent
Du et al.

(10) Patent No.: US 6,300,554 B1
(45) Date of Patent: Oct. 9, 2001

(54) METHOD OF FABRICATING THERMOELECTRIC SENSOR AND THERMOELECTRIC SENSOR DEVICE

(75) Inventors: Chen-Hsun Du; Bruce C. S. Chou; Chengkuo Lee, all of Hsinchu (TW)

(73) Assignee: Metrodyne Microsystem Corp., Hsinchu (TW)

( * ) Notice: Subject to any disclaimer, the term of this patent is extended or adjusted under 35 U.S.C. 154(b) by 0 days.

(21) Appl. No.: 09/392,574

(22) Filed: Sep. 9, 1999

(51) Int. Cl.[7] ................................................ H01L 35/34
(52) U.S. Cl. ..................... 136/201; 136/215; 136/224; 136/213
(58) Field of Search ............................ 136/201, 215, 136/213, 224

Primary Examiner—Kathryn Gorgos
Assistant Examiner—Thomas H Parsons

(57) ABSTRACT

A thermoelectric sensor device is disclosed consisting of polysilicon, titanium or AlSiCu as the thermocouple of material for thermoelectric sensor device. The features of the present process are: Selecting a material such as aluminum, titanium, aluminum alloy or titanium alloy with lower thermal conductivity coefficient as thermocouple element line and making use of zigzag structure with thermocouple element line, and increasing the length of thermocouple element line. Employing front side Si bulk etching technique to etch the silicon substrate, which is under the device and empty of silicon substrate, so as to reduce the superficial measure of thermoelectric sensor module and increase the throughout of the silicon wafer. Simultaneously, fabricating a resistor to treat as a heater on the membrane for adjusting the device.

23 Claims, 11 Drawing Sheets

METHOD OF FABRICATING THERMOELECTRIC SENSOR AND THERMOELECTRIC SENSOR DEVICE

BACKGROUND OF THE INVENTION

1. Field of the Invention

The present invention relates to a method of fabricating a thermoelectric sensor. More particularly, the present invention relates to increasing the length of the thermocouple element line and decreasing the heat conductivity by using a zigzag structure, or a meander structure, of the thermocouple element line, as well as etching the silicon substrate by using front side Si bulk set etching. This invention will not only increase the gross die throughput of the silicon wafer, but also make a resister to be treated as a heater on the sensor membrane structure for electrical calibration of the device.

2. Description of the Prior Art

Infrared radiation detectors measure an object temperature by receiving and counting the infrared ray intensity generated from the object. It is a so-called non-contact temperature measurement. The typical applications include in-situ monitoring of semiconductor process steps, infrared spectroscopy, detection of various gases and liquids in industrial process environments, and measurement of temperature distribution in house for air conditioner. These applications also include medical thermography and clinical tympanic thermometers, and security applications for a passive intrusion detector. The operation principle basically is that the infrared rays radiate onto the detector, causing the temperature of a radiation absorber area to rise. Then this temperature increase will cause a change in physical nature of the device. This change can be converted into a change of electrical output. The common sensors are known as pyroelectric sensor, bolometer, and thermopile.

The pyroelectric sensor is made of ceramics of polymer, and it needs to be carefully treated during assembly and packaging. The manufacturing cost of pyroelectric sensors is comparatively high than thermoelectric sensors, since a thermoelectric sensor can be batch fabricated by using semiconductor mass production line. On the other hand, the bolometer sensor needs bias to measure the variation of its resistance and 1/f noise will occur due to such bias reading. The thermopile, i.e., the thermoelectric sensor, is a group of thermocouples connected in series. A thermocouple consists of a pair of dissimilar conductors so joined at two points that an electromotive force is developed by the thermoelectric effect when these two points, i.e., junctions, are at different temperatures. The thermoelectric sensor requires no additional bias, and is useful over a wide range of ambient temperatures. Because the thermoelectric sensor can be fabricated by semiconductor process technology, it is easily interlaced with monolithic integrated circuits. As a result, the thermoelectric sensor shows strong market potential and cost competitiveness.

From the view point of sensor function, if the device can include a thermoelectric sensing element and amplifying circuit, then the function and performance of the device will be increased, and the noise of signal interface will be decreased as well. It points out that the advantage of developing a compatible thermoelectric sensing element with the standard CMOS process. This arrangement provides the possibility of integrating a thermoelectric sensing element and signal processing circuit into a monolithic integrated circuit (IC) sensor.

According to the post-process that thermoelectric sensors in the prior art were usually possessed of the freestanding membrane structure made by back side silicon wet etching, but this way exhibits shortcomings as below:

Referring to FIG. 1A, a cross-sectional view of the rim of a thermoelectric sensor is shown. A silicon substrate 1, a close membrane 2, a plurality of first thermocouple element lines 3, isolation layer 4, a plurality of second thermocouple element lines 5, and radiation absorber layer 6 are provided. The radiation absorber layer 6 that is isolated to the isolation layer 4' couples with the first thermoelectric element line 3 and second thermocouple element line 5. The close membrane 2, first thermocouple element line 3, isolation layer 4, and second thermocouple element line 5 are symmetrical as a result of the rim of thermoelectric sensor.

FIB. 1B shows the connection of interconnects according to the thermoelectric sensor of FIG. 1A. The opening of first thermocouple element line 3 couples the extremity of second thermocouple element line 5 with heated junction H nearby radiation absorber layer 6 by way of series connection, and cold junction C is distant from radiation absorber layer 6. The first cold junction C of first thermocouple element line 3 couples electrically to the first metal pad 7, and the last cold junction C of second thermocouple element line 5 couples electrically to the second metal pad 8.

The heated junction H is located above close membrane 2 and located beneath radiation absorber layer 6, and its temperature will be increased due to the heat coming from radiation absorber layer 6. This radiation absorber layer 6 will be heated when it received infrared radiation. The cold junction C is located on silicon substrate 1. Its temperature will be the same as the ambient temperature, because silicon substrate has high solid conductance and heat from cold junction dissipates through silicon substrate 1. In order to form the close membrane 2, the silicon anisotropic wet etching process is applied to remove the underneath silicon substrate from close membrane 2. If the etching window is formed on the backside of silicon substrate, then the etching solution will attack silicon from the backside. A larger etching window area is necessary to define the area of close membrane 2, due to the different etching rate of silicon crystal facet. It means the overall device size will become much larger than the defined close membrane 2 area, since the backside etching window is larger than the defined close membrane 2 area, and the device must be larger than the backside etching window. However, if the etching window is formed on the front side of silicon substrate, then the induced cavity will be like the one shown in FIG. 2A. It means the overall device size will become almost the same as the defined close membrane 2 area. In such case, a cantilever beam of a 4-arm bridge will be generally used to support the structure of radiation absorber layer and the group of thermocouples. Ascribing to the different sizes of device made by front side or backside silicon anisotropic wet etching, the gross die of thermoelectric sensor from the wafer made by front side wet etching will be larger than the one made by backside wet etching.

In general, the characteristics of thermoelectric sensor express with responsivity in volts per watt (Rv), Johnson noise ($V_j$), Noise Equivalent Power (NEP), and specific detectivity (D*). The corresponding formula is according to the following equation:

$$R_v = \frac{N\alpha}{G_s + G_g + G_r} \qquad (1)$$

$$V_J = \sqrt{4kTR\Delta f} \qquad (2)$$

$$NEP = 10 \frac{V_J}{R_v} \quad (3)$$

$$D^* = \frac{\sqrt{A\Delta f}}{NEP} \quad (4)$$

Where N is the number of thermocouples, and a is the seebeck coefficient (V/° C.). The $G_s$, $G_g$, $G_r$ are separately the thermal conductivity of solid, gas, and radiation, respectively. The k is Boltzmann's constant, T is the absolute temperature (° K.), R is the electrical resistance, $\Delta f$ is the bandwidth of the amplifier, and A is the area of radiation absorber layer.

According to the aforementioned illustration, thermoelectric sensor measures the temperature of an object, the sensor performance depends on the quantity of output signal and the sensitivity of temperature variation of a measured object. The responsivity Rv is the output voltage for unit input radiation power. It represents the output efficiency of a sensor. Noise equivalent power NEP is the input power when the output voltage of thermopile is equal to the noise level. The specific detectivity D* is the inverse number of NEP and normalized by the radiation absorber area and signal frequency. D* is the index of the sensor that express how small a signal can be detected. Because the thermal conductivity of structure materials of thermoelectric sensor is inversely proportional to values of Rv and D*, improvements to Rv and D* can be done by employing the lower thermal conductivity of the thermocouple element line or increasing the length of the thermocouple element line.

Referring to FIG. 1B, the first thermocouple element line 3 and the second thermocouple element line 5 are straight lines. The thermocouple element line 5 is usually made of aluminum that has high thermal conductivity. However, for the thermoelectric sensor fabricated by standard semiconductor CMOS process, the first thermocouple element line 3 is polysilicon and the second thermocouple element line 5 is aluminum. Therefore, the sensor performance is limited by the factor of high thermal conductivity of the second thermocouple element line 5. The overall thermal conductance decreases by increasing length of thermocouple element line, but the overall resistance of thermopile increases too. Because the resistance of polysilicon is high, the resistance of thermopile increases too. Because the resistance of polysilicon is high, the resistance of first thermocouple element line will increase rapidly as its length increases. As a result, the overall sensor performance is not simply increased in proportion to increment of length of thermocouple element line. The present invention discloses a zigzag structure of the second thermocouple element line to decrease the thermal conductance of the second thermocouple element line, while the length of the first thermocouple element line is kept the same. In such invention, the sensor performance can be promoted without changing the size of sensor or the size of membrane.

The general thermoelectric sensor measures the ambient temperature by using an off-chip temperature sensor, such as thermister, transistor or diode. The present invention applies the same material with the first thermocouple element line or the second thermocouple element line to form an on-chip temperature sensitive resistor that can be used to measure the ambient temperature. Besides, to avoid rising temperature of silicon substrate due to the dissipated heat power from the bias reading of this on-chip temperature sensitive resistor, the resistance of this on-chip resistor is designed to be greater than 100 KΩ.

Furthermore, in the non-contact temperature measurement, the object temperature can be calculated from the output voltage value of thermoelectric sensor. The output voltage, or responsivity, may decrease or deteriorate due to the aging of thermocouple materials caused by strong environment variation and storage damage. This effect will lead to the measurement deviation in the long term. It also costs the manufacturer to use expensive electrical circuits to calibrate these effects for commercial product. The present invention provides a method that a heater resistor is made on the neighboring area of a hot junction and is used to calibrate the drift effect of thermocouple materials by following electrical calibration method.

The prior thermoelectric sensor comprises metal can of four pins that has two pins for thermoelectric sensor and two pins for off-chip ambient temperature sensor. The present invention provides a metal can package of the thermoelectric sensor in which it has 5 pins or 6 pins. It provides two pins for thermoelectric sensor, two pins for on-chip temperature sensitive resistor, and two pins for the heater resistor, while the temperature sensitive resistor and heater resistor can share a common ground. The two pins of thermoelectric sensor are isolated from the metal can to reduce the noise influence.

For prior thermoelectric sensors, some significant patents are as follows:

(1) U.S. Pat. No. 4,665,276, Thomas Elbel, Jurgen Muller, Friedemann Volklein, "Thermoelectric Sensor"

(2) U.S. Pat. No. 5,100,479, Kensall D. Wise, Khalil Najati, "Thermopile, Infrared Detector with Semiconductor Supporting RIM"

(3) U.S. Pat. No. 4,456,919, Katsuhiko Tomita, Tatsuo Shimizu, Masaichi Bandoh, "Thermopile Type Detector with Temperature Sensor for Cold Junction"

The U.S. Pat. No. 4,665,276 discloses a thermoelectric sensor of the backside wet etched membrane structure comprising a thin-film thermopile, and providing Be, Sb as the thermoelectric materials.

The U.S. Pat. No. 5,100,479 discloses a thermoelectric sensor consisting of a heavy doped silicon-supporting rim. The rim supports a series of polysilicon and metal thermocouples. It also serves as a good thermal conductor for supporting the cold junctions and removing the heat from the cold junctions.

The means of thermoelectric sensor according to the aforementioned two patents employ close membrane structure of backside wet etching, but the present invention employs open membrane structure of front side wet etching.

The U.S. Pat. No. 4,456,919 discloses a thermoelectric sensor with on-chip diode or transistor that is made at the same fabrication procedure of thermoelectric sensor. This diode or transistor is used to detect ambient temperature for temperature compensation purposes. The present invention uses the first thermocouple element line or second thermocouple element line to form an on-chip temperature sensitive resistor, i.e., a thermister. This on-chip temperature sensitive resistor can be made at the same fabrication procedure of thermoelectric sensor.

Reference in this regard is made to the following articles:

(1) G. R. Lahij i and K. D. Wise, "A batch-fabricated silicon thermopile infrared detector", IEEE Trans. Electron Devices ED-29, pp 14–22, (1982).

(2) R. Lenggenhager, H. Baltes, J. Peer and M. Forster, "Thermoelectric infrared sensors by CMOS technology", IEEE Electron Device Letters 13, 454, (1992).

(3) T. Akin, Z. Olgun, O. Akar, and H. Kulah "An integrated thermopile structure with high responsivity using any stndard CMOS process", Sensors and Actuators A66, pp.218–224 (1998).

(4) H. Baltes, "CMOS as Sensor Technology", Sensors and Actuators A37–38, pp.51–56 (1993).

(5) HL-PLANAR Technik Catalog of Thermosensors (TS 10060), HL-Planartechnik GmbH, Hauert 13 44 227 Dortmund, Germany.

According to aforementioned papers, Lahiji and Wise propose a close membrane structure comprising thermoelectric materials of Au and polysilicon, and use the backside silicon anisotropic wet etching to form the close membrane structure. Lenggenhager et al. provide the thermoelectric material of aluminum and polysilicon, and employ open membrane structure by front side silicon anisotropic wet etching. The radiation absorber layer is composed of $Sio_2$ and SiN. Kulah et. al, provide a structure that the open membrane structure made by front side silicon anisotropic wet etching, while the thermoelectric materials use n-poly and p+-active layers of standard CMOS process. However the electrochemical etch-stop technique is necessary to protect p+-active layer from wet etching during removing underneath silicon substrate process. This approach leads to a complex process and causes a decrease in the yield of gross die.

Besides, the method of the reference paper (4) is disclosed that a heater resistor is placed on the membrane and used to measure the thermal conductance of the structure. But, in the present invention, a heater resistor is made on the neighboring area of hot junction is used for electrical calibration against the aging of thermoelectric materials. The reference materials (5) employ an on-chip Ni thermister as the temperature sensor, while the present invention employs the material as same as first or second thermocouple element line to form the on-chip temperature sensitive resistor. This on-chip temperature sensitive resistor and the thermopile structure are fabricated at the same time.

When the normalized output is derived versus the different incident radiation angle, we find the 100% normalized output happened at the radiation incident angle of about ±10° deviated from the normal direction of the plane of radiation absorber layer, and 85% normalized output is observed in the case of incident angle of about 0°. This fact is ascribed to some reflected radiation energy from the Si (111) facet of v-groove cavity being absorbed by the radiation absorber layer. The present invention discloses a reflective mirror to cover the front side etching window to avoid the radiation penetrate through the front side etching window and incident on Si (111) facet, then reflected and incident onto radiation absorber layer. This reflective mirror plate is located at the position of the front side etching window, and can be made at the same time of making the thermoelectric sensor structure. This reflective mirror plate comprises aluminum for the reflection purpose.

The present invention is a cost-effective method. The advantages of polysilicon/metal thermocouples are simple to be fabricated by standard CMOS process. How to promote the gross die, yield, and upgrade the sensor performance is the subject matter of the present invention.

SUMMARY OF THE INVENTION

According to the embodiment of the present invention, the present invention provides a method of fabricating thermoelectric sensor, so as to improve the disadvantages found in the prior art.

The distinguishing features of the method of the present invention are disclosed below:

(1) Selecting a material with lower thermal conductivity coefficient as thermocouple element line and making use of photolithographic method to form a meander or zigzag structure of thermocouple element line. It could increase the length of thermocouple element line and decrease the heat conductance, and then increase the sensitivity and performance of thermoelectric sensor without increasing the die size.

(2) Selecting titanium alloy with a lower thermal conductivity as a material thermocouple element line and decreasing the solid thermal conductance thereafter.

(3) Fabricating a resistor to be treated as a heater on the neighboring area of hot junction is used for electrical calibration against the aging of thermoelectric and other structure materials and environmental effects, and then increasing the precision of non-contact temperature measurement in a long term of operation.

(4) Employing titanium thin film and its relative alloy from the semiconductor industrial process technology to the radiation absorber layer.

(5) Opening an etching hole on the free-standing, or floating, membrane of radiation absorber layer and isolation layer to shorten the etching time and to increase yield.

(6) Employing front side silicon anisotropic wet etching technique to remove the underneath silicon substrate of open membrane structure of thermoelectric sensor. Then heated junction is suspended or thermal isolated from silicon substrate, so as to increase signal output. The method provides higher gross die, easier package, easier process than prior art, and comparatively reduces etching time and possible damage of sensing element.

(7) Selecting the same material as first or second thermocouple element line as an on-chip temperature sensitive resistor, and resistance of this resistor is greater than 100 KΩ.

(8) Forming a reflective mirror to cover the front side etching window to avoid influence of reflected radiation from Si (111) facet of underneath v groove. This reflective mirror plate is made at the same time of making the thermoelectric sensor structure. This reflective mirror plate comprises aluminum film for reflection.

(9) Selecting 5 pins or 6 pins of metal can.

In order to reach the aforementioned purpose, the present invention provides a method of fabricating thermoelectric sensor, comprising the following steps:

Providing a silicon substrate. Depositing a first isolation layer on the surface of the silicon substrate. Depositing a thermocouple element material layer on the surface of the first isolation layer. This material could be polysilicon, amorphous silicon, or metals. Masking defining and etching the part of the thermocouple element material layer to form a first thermocouple element line. Depositing a second isolation layer on the surface of the first thermocouple element line and the first isolation layer. Patterning and etching the part of the second isolation layer to form a plurality of contact windows or contact vias. Depositing a metal layer on the surface of the second isolation layer. Patterning and etching the part of this metal layer to form a second thermocouple element line, and the second thermocouple element line contacts the first thermocouple element line with a plurality of heated junctions and cold junctions by previous mentioned contact windows. Depositing a third isolation layer on the surface of the second thermocouple element line and the second isolation layer. Patterning and etching the part of the third isolation layer and the second isolation layer, whereby the part of the last second thermocouple element line is exposed, then electrically coupled onto the second metal pad in a next step, and the first thermocouple made of the first thermocouple element line is electrically coupled onto the first metal pad through the connection of this second thermocouple element line. Depositing a second metal layer above the third isolation layer. Patterning and etching the part of the second metal layer and forming the first metal pad and second metal pad. Then the electrically coupling of a group of thermocouple and metal pad is formed. Depositing a fourth isolation layer above the third isolation layer and the second metal layer. Depositing a third metal layer above the fourth isolated layer, and defining the radiation absorber layer by means of etching or lift-off (inverse masking), thereby it may absorb infrared rays in operation. Depositing a fifth isolation layer on the surface of the fourth isolation layer and the radiation absorber layer; Etching the part of the fourth isolation layer and the fifth isolation layer, and forming bonding windows on the first metal pad and the second metal pad. Patterning and forming front side etching windows by etching through the fifth isolation layer, the fourth isolation layer, the third isolation layer, the second isolation, and the first isolation layer, and then the surface of the silicone substrate is exposed. Etching the silicon substrate via the front side etching windows by silicon anisotropic wet etching technique to thereby undercut or empty the silicon substrate underneath the thermocouple membrane area.

Referring to a previously mentioned method of making the electrically connection between a group of thermocouples and metal pads, another method to make an electrical connection is as described: Patterning and etching the part of third isolation layer and the second isolation layer, whereby the part of the last second thermocouple element line and the part of the first thermocouple element line are exposed. Depositing a second metal layer above the third isolation layer. Patterning and etching the part of the second metal layer and then forming the connection line between each couple of the first thermocouple element and the second thermocouple element, and forming the first metal pad and second metal pad as well. Then forming an electrical connection between a group of thermocouples and metal pads. Depositing a fourth isolation layer above the third isolation layer and the second metal layer. Thereby the same procedure to make the radiation absorber layer and front side etching windows, and wet etching are used to form the final structure of thermoelectric sensor.

According to the aforementioned process, the signal output of the thermoelectric sensor device is measured between the first metal pad and the second metal pad. The thermoelectric sensor structure will now be described.

A silicon substrate and a first isolation layer are formed on the surface of the silicon substrate. A plurality of first thermocouple element lines are formed on the surface of the first isolation layer, wherein each of the first thermocouple element lines have a heated junction and a cold junction, and the first cold junction of a first thermocouple element line is electrically coupled to the first metal pad. A second isolation layer is formed on the surface of the first thermocouple element line. A plurality of second thermocouple element lines are formed on the surface of the second isolation layer, wherein the second thermocouple element line is defined and patterned as meander structure or zigzag structure, wherein each of the second thermocouple element lines have a heated junction and a cold junction, the heated junction of the second thermocouple element line connects with the heated junction of the first thermocouple element line, and the last cold junction of the second thermocouple element line is electrically coupled to the second metal pad. A third isolation layer is formed on the surface of the second isolation layer and the second thermocouple element line. A second metal layer is formed on the first metal pad and the second metal pad. A fourth isolation layer is formed on the surface of the third isolation layer, the first metal pad, and the second metal pad. A radiation absorber layer is formed on part of the surface of the fourth isolation layer for absorbing infrared rays. A fifth isolation layer is formed on the surface of the fourth isolation layer and the radiation absorber layer. Bonding windows are formed on the first metal pad and the second metal pad via etching of part of the fourth isolation layer and the fifth isolation layer. Front side etching windows are formed on the silicon substrate via etching through the fifth isolation layer, the fourth isolation layer, the third isolation layer, the second isolation layer, and the first isolation layer. The silicon substrate underneath the thermocouple membrane area can be wet etched through the front side etching windows. A heater resistor using the same material as first or second thermocouple element line is fabricated on the neighboring area of hot junction and is used for electrical calibration against the aging of thermoelectric and other structure materials and environmental effects. An on-chip temperature sensitive resistor using the same material as the first or second thermocouple element line with resistance greater than 100 KΩ is fabricated at the same time when the thermoelectric sensor is made by the semiconductor process technology. Reflective mirrors to cover the front side etching window to avoid influence of reflected radiation from Si (111) facet of underneath v-groove are made at the same time of making the thermoelectric sensor structure. This reflective mirror plate comprises aluminum film for reflection.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, which are given by way of illustration only and thus are not limitative of the present invention, and wherein.

DESCRIPTION OF THE PREFERRED EMBODIMENT

The embodiments of the present invention will now be described in detail with reference to the figures.

Figure 1A:
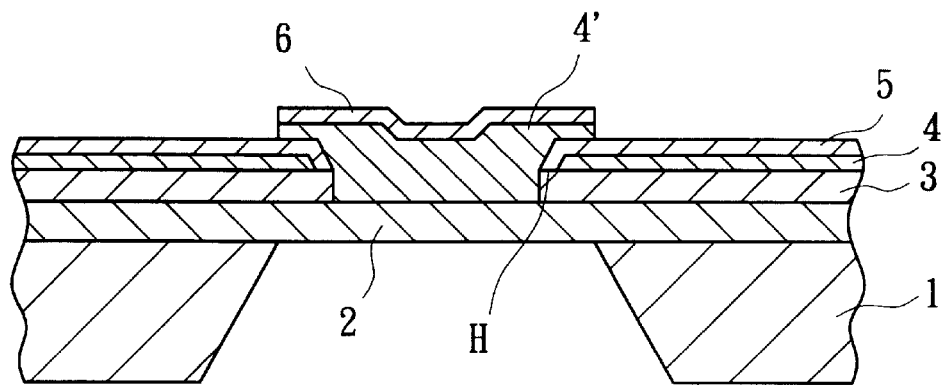
FIG. 1A is a cross-sectional view of the rim of a thermoelectric sensor of the prior art.
Figure 1B:
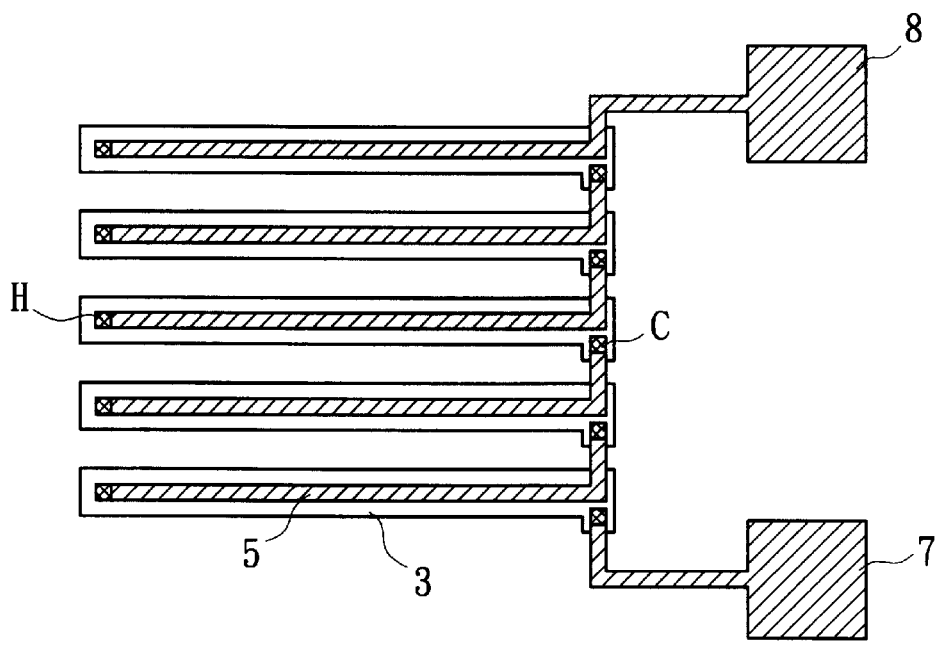
FIG. 1B shows the connection of interconnects in accordance with thermoelectric sensor of FIG. 1A of the prior art.
Figure 2A:
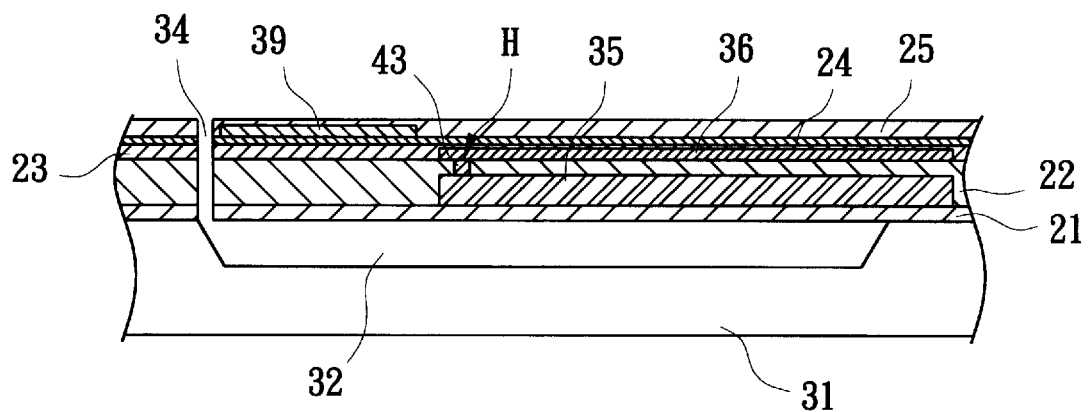
FIG. 2A is a cross-sectional view of the thermoelectric sensor in accordance with the present invention.

Referring to FIG. 2A, a cross-sectional view of the thermoelectric sensor in accordance with the present invention is shown. The thermoelectric sensor is provided with a silicon substrate 31, a plurality of first thermocouple element lines 35, a plurality of second thermocouple element lines 36, a radiation absorber layer 39, a front side etching window 34, an underneath v-groove cavity formed by anisotropic wet etching 32, a plurality of contact windows of hot junction H, first isolation layer 21, second isolation layer 22, third isolation layer 23, fourth isolation layer 24, and fifth isolation layer 25.

Figure 2B:
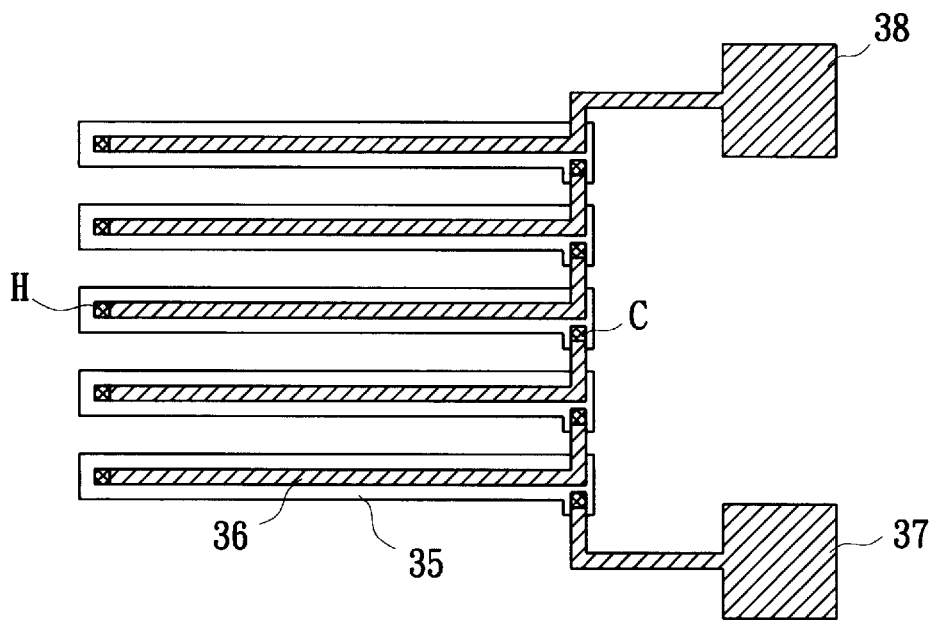
FIG. 2B shows the connection of the thermoelectric element line of two layers in accordance with the thermoelectric sensor of FIG. 2A.

FIG. 2B shows the connection of the thermocouple of two element lines in accordance with the thermoelectric sensor of FIG. 2A. Referring to FIGS. 2A, 2B, the second thermocouple element line 36 contacts the first thermocouple element line 35 with hot junction H via contact windows 43 of the third isolation layer 23. The last line of the second thermocouple element lines 36 is electrically coupled to a second metal pad 38. The first line of first thermocouple element lines 35 is electrically coupled to a first metal pad 37. The first metal pad 37 and second metal pad 38 act as output electrodes of the thermoelectric sensor.

As aforementioned structure, FIGS. 3A–3J shows the cross-sectional views of the steps for fabricating the thermoelectric sensor in accordance with the present invention.

Figure 3A:
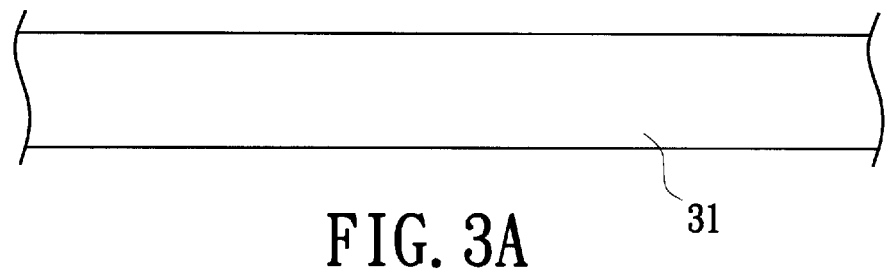
FIGS. 3A–3J show the cross-sectional views of the process steps for fabricating the thermoelectric sensor in accordance with the present invention.
Figure 3B:
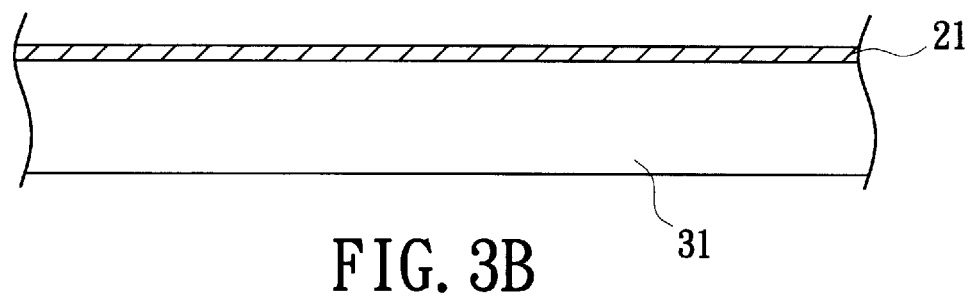
Figure 3C:
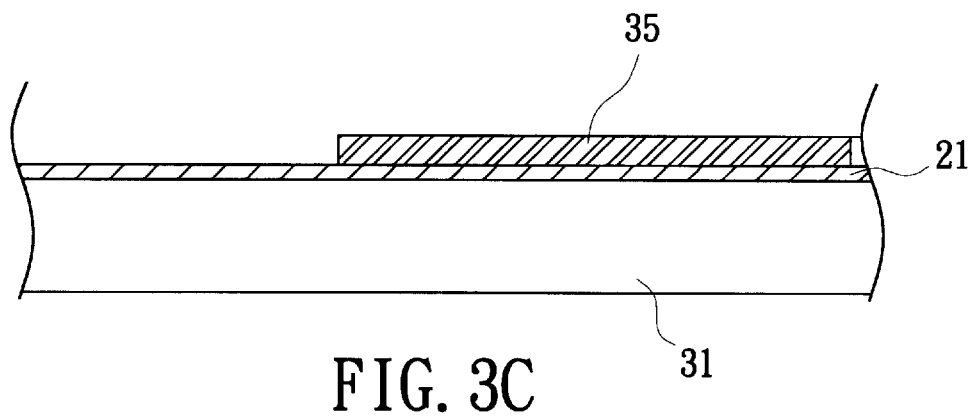
Figure 3D:
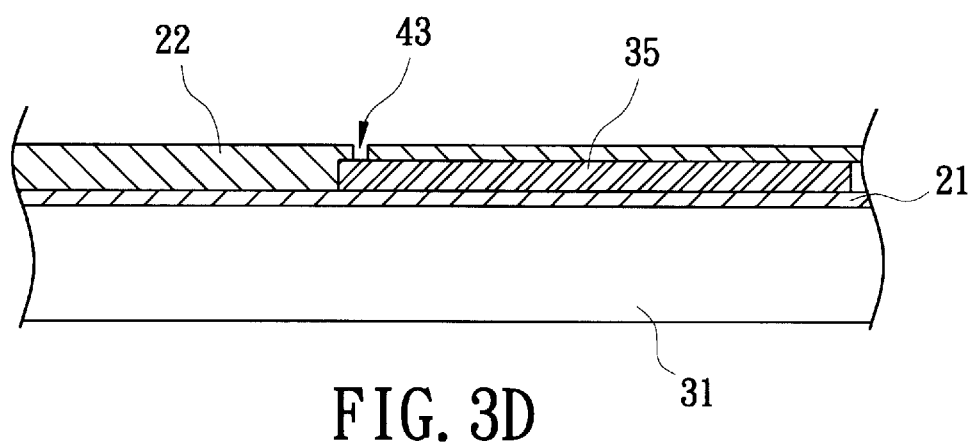

First, providing a silicon substrate 31 and depositing a first isolation layer 21 on the surface of the silicon substrate, shown as the FIG. 3B, part of the silicon substrate 31 underneath thermocouple structure will be removed by the anisotropic wet etching in the following steps. A first thermocouple element layer that comprises metal, or polysilicon, or amorphous silicon is deposited on the surface of the first isolation layer. As shown in FIG. 3C, the part of the first thermocouple element layer is patterned by photolithography and dry etching process, which form a first thermocouple-element line 35 on the part surface of the first isolation layer 21. A second isolation layer 22 is deposited on the surface of first thermocouple element line 35 and first isolation layer 21, and a planarization and etching of the part of second isolation layer 22 is performed to form plurality of contact windows 43 of hot junction. The first thermocouple element line 35 is exposed at the bottom of contact windows 43, as shown in FIG. 3D.

Figure 3E:
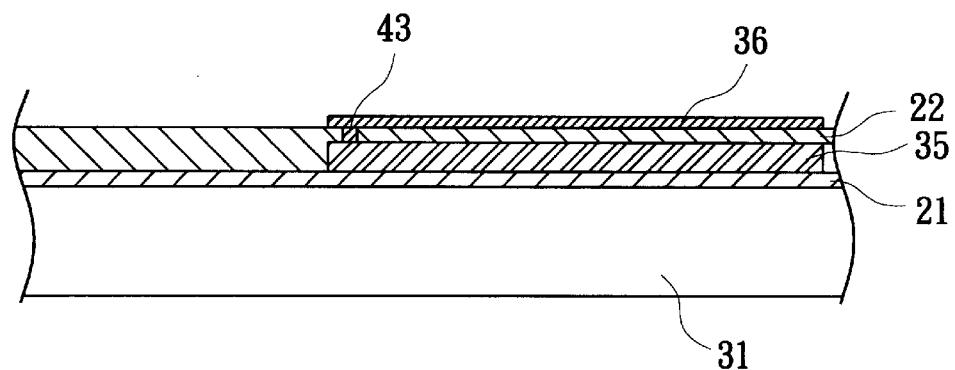

A first metal layer is deposited on the surface of the second isolation layer 22, and the first metal layer fills the contact windows 43. After deposition process, patterning of the first metal layer to form the second thermocouple element line 36 on the surface of the second isolation layer 22 occurs. The electrical connection between the first thermocouple element line 35 and the second thermocouple element line 36 is formed via contact windows 43, as shown in FIG. 3E. The second thermocouple element line 36 contacts the first thermocouple element line 35 at hot junctions H of contact windows 43, and at cold junctions C (not shown in figure) via the contact windows (not shown in figure).

After forming the second thermocouple element line 36, the third isolation layer 23 is deposited on the surface of the second thermocouple element line 36 and the second isolation layer 22. Etching the third isolation layer 23 and the second isolation layer 22 is done and then the part of the first line of the first thermocouple element line 35 and the last line of the second thermocouple element line 36 are exposed at the cold junction area. These exposure parts on the cold junction of the first line of the first thermocouple element line 35 and the last line of the second thermocouple element line 36 are the contact windows for the next step of forming electrical connection to bonding metal pads. Then, the second metal layer is deposited on the third isolation layer 23 and the contact windows on the cold junctions of the first line of the first thermocouple element line 35 and the last line of the second thermocouple element line 36. The second metal layer fills the contact windows. After the deposition process, the second metal layer is patterned to form the metal pad 37, the metal pad 38, the electrical connection line between the first line of the first thermocouple element line 35 and metal pad 37, and the electrical connection line between the last line of the second thermocouple element line 36 and metal pad 38 (not shown in the FIGS. 3E–3F). Thereafter the last line of the second thermocouple element line 36 is electrically coupled to the second metal pad 38. The first line of the first thermocouple element line 35 is electrically coupled to first metal pad 37, as shown in FIG. 2B.

Figure 3F:
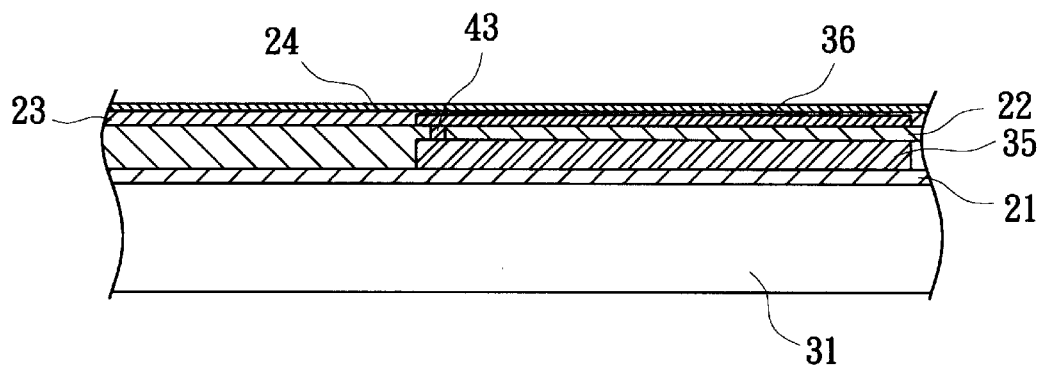
Figure 3G:
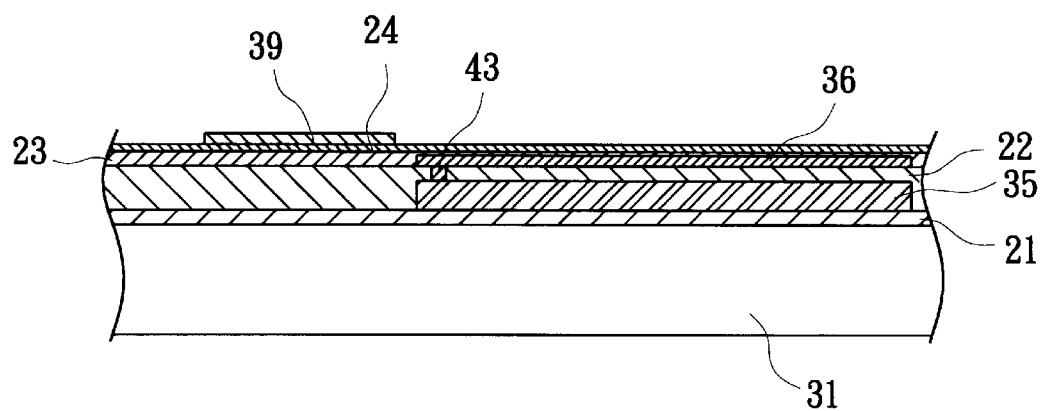
Figure 3H:
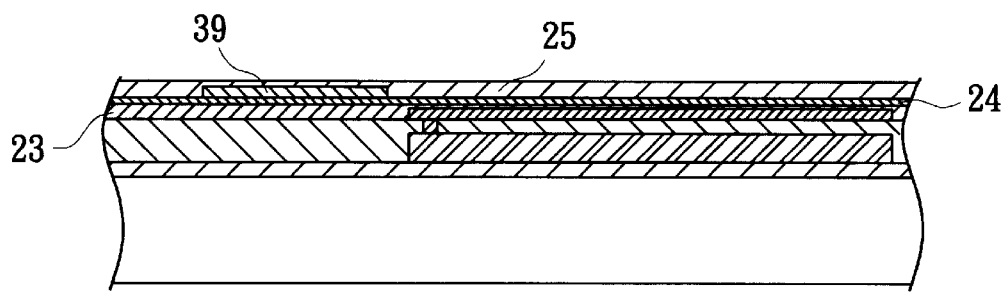

As shown in FIG. 3F, depositing of the fourth isolation layer 24 on the third isolation layer 23 and the second metal layer occurs. Then deposition of the third metal layer on the aforementioned fourth isolation layer 24 occurs whereby the method of etching or lift off to define the radiation absorber layer 39 to absorb the incident infrared rays, as shown in FIG. 3G. The material of the radiation absorber layer is selected from a group consisting of titanium, or titanium nitride, or titanium alloy, and other alloys.

Figure 3I:
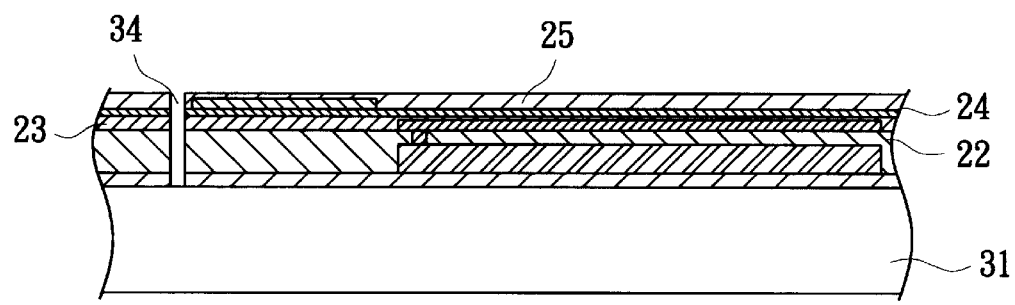
Figure 3J:
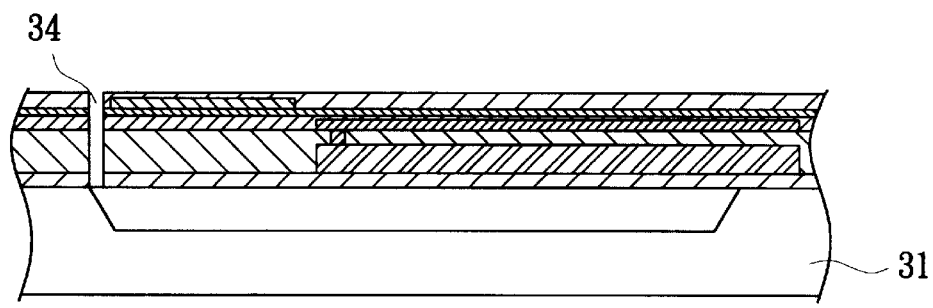

After forming the radiation absorber layer 39, the fifth isolation layer 25 is deposited on the surface of the fourth isolation layer 24 and the radiation absorber layer 39. Etching the part of the fourth isolation layer 24 and the fifth isolation layer 25 to open windows (not shown in Figures) on the first metal pad 37 and the second metal pad 38. Then the first metal pad 37 and the second metal pad 38 are exposed and act as output electrodes of thermoelectric sensor. Proceeding to pattern the part of the fourth and fifth isolation layer, 24, 25, the third isolation layer 23, the second isolation layer 22, and the first isolation layer 21 of the front side wet etching windows 34 are continuously etched away. Then bare surface of the silicon substrate 31 is exposed, as shown in FIG. 3I. Etching the silicon substrate 31 via the front side wet etching windows 34 by silicon anisotropic wet etching technique occurs to thereby undercut or empty the silicon substrate 31 underneath the thermocouple membrane area, as shown in FIG. 3J.

After the aforementioned steps of the present process are illustrated, a feature of present thermoelectric sensor structure will now be described.

To the aspect of the thermocouple element lines:

According to the embodiment of the present invention, the second thermocouple element line 36 is made of titanium or its related alloy. Due to not only the thermal conductivity coefficient of titanium (17W/K) being quite lower than thermal conductivity coefficient of AlSiCu alloy (~238W/K), but also to titanium being a good conductor, the responsivity (Rv) and specific detectivity (D*) are improved. The total thermal conductance of the thermocouple sensor becomes lower and the total resistance of the thermocouple sensor almost keep at the same level. The second thermocouple element line 36 is formed in the contact windows 43, so for this reason, the second thermocouple element line 36 acts as the connection line of the first line of the first thermocouple element line 35 to the second line of the first thermocouple element line 35, and the connection line of the second line of the first thermocouple element line 35 to the third line of the first thermocouple element line 35, and so on, as shown in FIG. 2B.

Figure 2C:
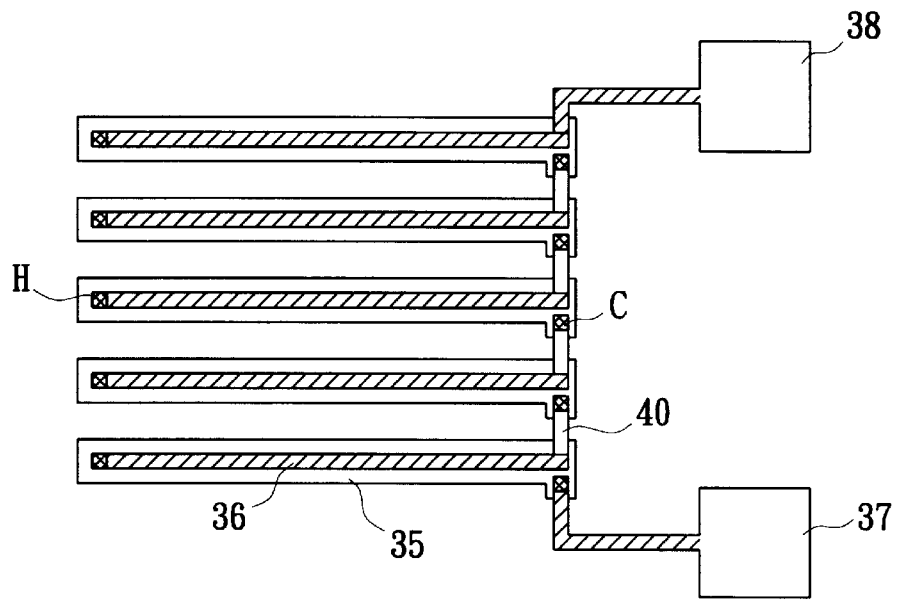
FIG. 2C shows the connection of the thermoelectric element line of three layers in accordance with the thermoelectric sensor of FIG. 2A.

In another embodiment of the present invention, the foregoing second metal layer substitutes for the second thermocouple element line 36 as the connection lines 40, the interconnection way being shown in FIG. 2C. In this way, the second metal layer is deposited on the third isolation layer 23 and the contact windows on the cold junctions. The second metal layer fills the contact windows. After the deposition process, the second metal layer is patterned to form the connection lines 40, the metal pad 37, the metal pad 38, the electrical connection line between the first line of the first thermocouple element line 35 and metal pad 37, and the electrical connection line between the last line of the second thermocouple element line 36 and metal pad 38.

Furthermore, in another embodiment of the present invention, the material of the second thermoelectric element layer is employed as the first metal pad 37 and the second metal pad 38. Fabrication of the third isolation layer 23 and the second metal layer can be avoided.

Figure 2D:
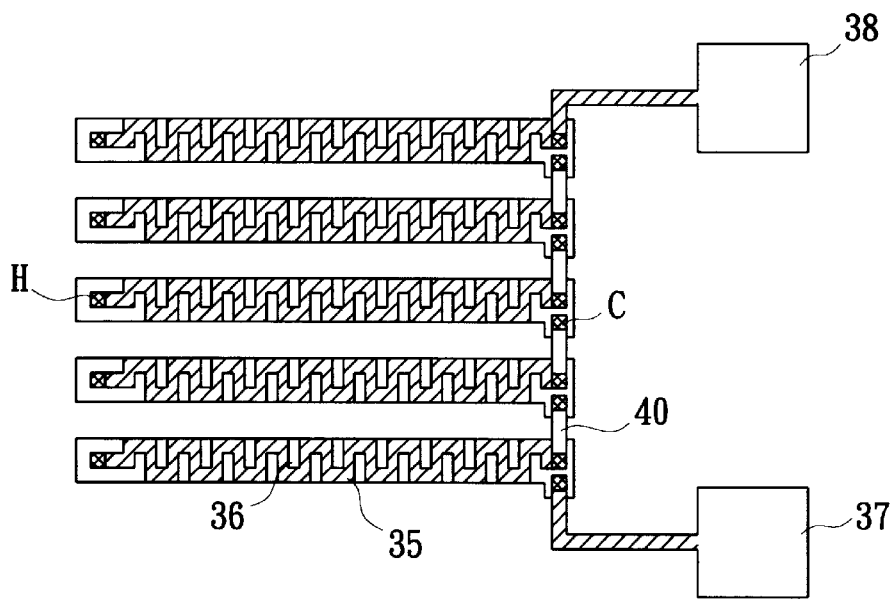
FIG. 2D shows the meander or zigzag structure of the second thermoelectric element line on the straight first thermoelectric element line in accordance with the thermoelectric sensor of FIG. 2A.

According to the aforementioned feature, the characteristic of the thermoelectric sensor improves by increasing the length of the thermocouple element line and therefore a zigzag structure, or a meander structure, of the thermocouple element line can be used to reduce heat conductivity. The present invention discloses a zigzag structure of the second thermocouple element line to decrease the thermal conductance of the second thermocouple element line, while the length of the first thermocouple element line is kept the same, as the structure shown in FIG. 2D. In such an invention, the sensor performance can be promoted without changing the size of the sensor or the size of the membrane. The aforementioned zigzag structure includes many kinds of geometric configuration such as a single zigzag layer structure, a multi-layer zigzag structure, a sinuous shape structure or other structures depending on the requirement for the user. Further, the first thermocouple element line 35 can also be the zigzag structure, if the materials of the first thermocouple element line 35 have a high thermal conductivity and low electrical resistivity.

In addition, the principle of the prior thermoelectric sensor is that the absorbed thermal radiation heat of radiation absorber layer 39 is translated to a temperature difference between the hot and cold junction, and then an output voltage of the thermoelectric sensor can be derived due to this temperature difference. The value of this voltage output is used to calculate the temperature of the object based on the Stefan-Boltzmann law. However, this output voltage may decrease or deteriorate due to the aging of thermocouple materials in which is caused by strong environment variation and storage damage. Besides, this voltage may vary as the drift of characteristics of read out electrical circuit. This effect will reduce the measurement precision in the long term. The present invention provides a resistor to be a heater and is made on the neighboring area of hot junction. This heater resister is used to calibrate the drift effect based on the following electrical calibration measurement.

The principle of the electrical calibration measurement will now be simply described. A thermoelectric sensor structure with a heater resistor is made on the neighboring area of hot junction. The output voltage from the thermoelectric sensor is measured when a pulse voltage or ac voltage is applied to the heater resister in the case of that the infrared ray radiation from objects is shielded. Then the output voltage of the thermoelectric sensor is only related to the input heat from the applied bias to heater resistor. This way can be used to simulate the output voltage caused by a rising temperature difference of thermoelectric sensor when the radiation energy is received from the objects. In other words, the power and the rising temperature of the heater are proportional to the power and the rising temperature of the incident radiation. For the practical application, before measuring the temperature of an object like a human body, shielding the radiation to the thermoelectric sensor by a shutter in advance, then power Wh is supplied to the heater and output voltage Vh is measured. Thereafter removing $$\frac{W_t}{W_h} = k \times \frac{V_t}{V_h} \qquad (5)$$

$$\Rightarrow W_t = k \times \frac{V_t}{V_h} \times W_h \qquad (6)$$

the shutter, the power $W_t$, is received from the object and radiates onto the radiation absorber layer. Then the output voltage $V_t$ of the thermoelectric sensor can be measured. The power $W_t$, can be calculated according to the input, or default, value of the Wh, the measured values of the $V_h$, and $V_t$. The related equations can be shown as discussed below.

Where k is a ratio constant. It can be calibrated and derived when the precise measurement performed with a known blackbody temperature and a known input bias to the heater. The output effect of the thermoelectric sensor influences the $V_h$ and $V_t$, with the same trend or ratio according to the drift effect of environment, time or read out of electrical circuit. But the exact measurements of the radiation and temperature of an object can be measured precisely, because $V_h/V_t$, is kept at the same.

Figure 7B:
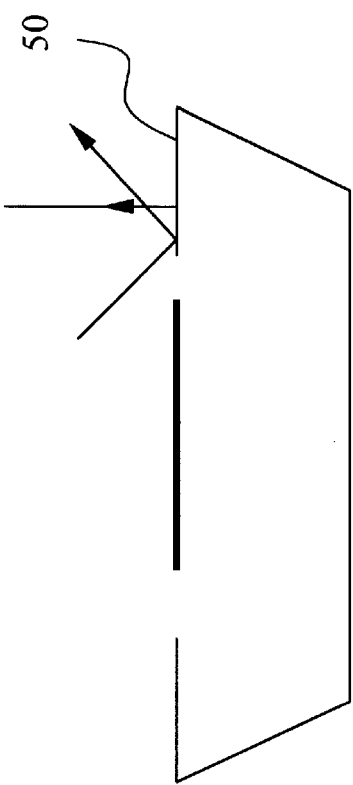
FIG. 7B shows the cross sectional schematic of using the reflective mirrors to cover the front side etching window to avoid influence of reflected radiation from Si (111) facet of underneath v-groove in accordance with the preferred embodiment of the present invention.
Figure 7A:
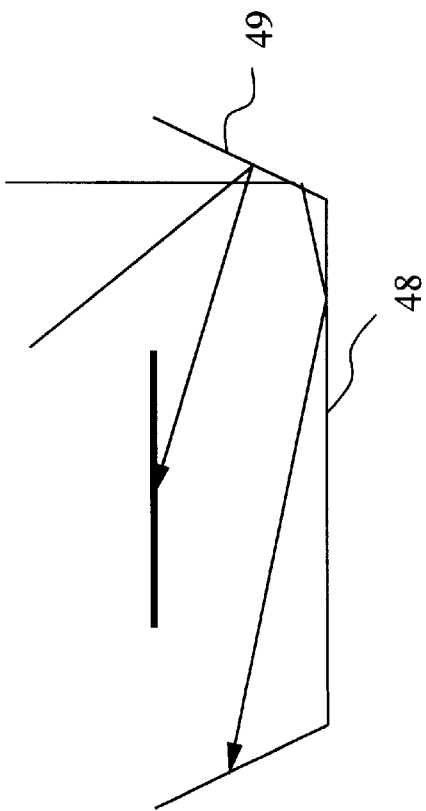
FIG. 7A shows the cross sectional schematic of reflective light paths of the incident infrared rays due to the influence of reflected radiation from Si (111) facet of underneath v-groove in accordance with the embodiment of the present invention.
Figure 8:
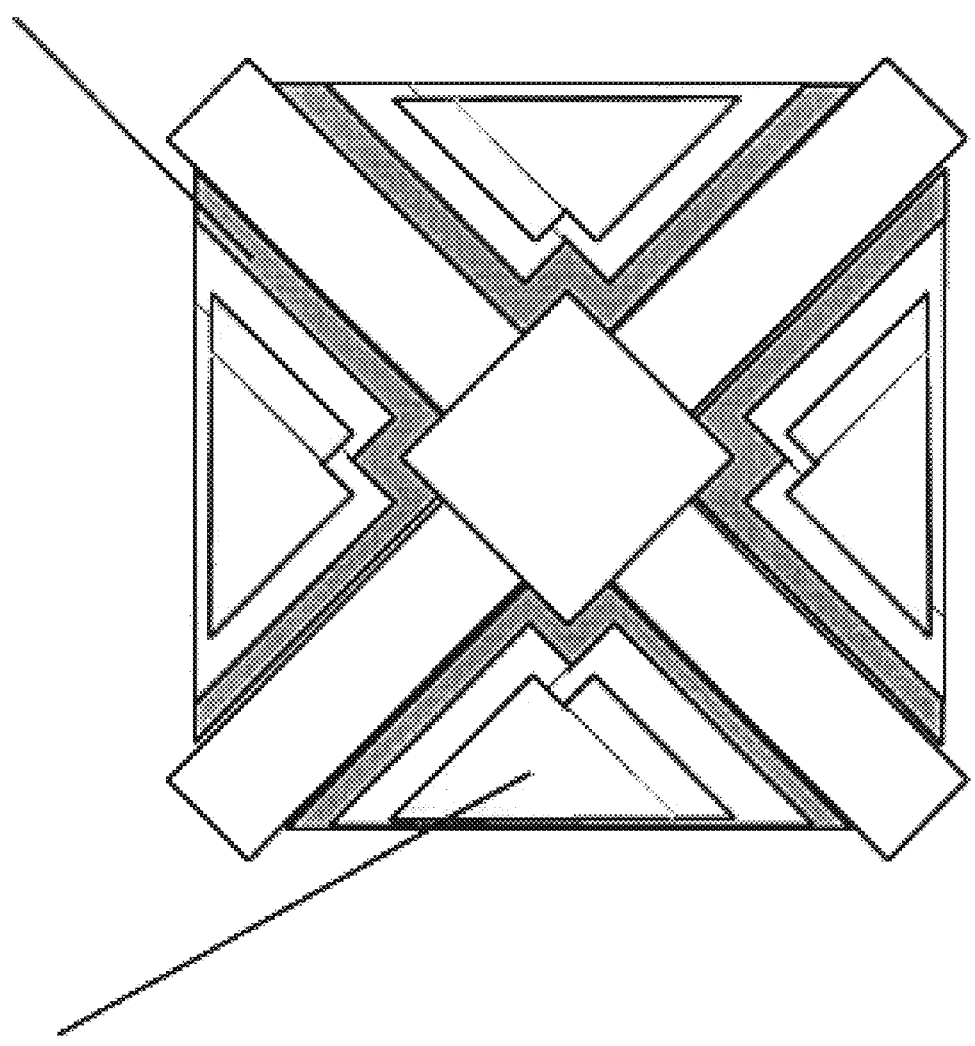
FIG. 8 shows the top view of the reflective mirrors, in accordance with the embodiment of the present invention.

According to another embodiment of the present invention, the larger opening of the front side wet etching windows 34 will result in infrared ray being reflected from the bottom 48 or v-grove side wall 49 of the anisotropically undercut cavity. And this infrared ray will be incident on the back side of the radiation absorber layer of the thermoelectric structure. To avoid this effect, reflective mirrors SO comprising the first metal and/or second metal are proposed to reflect the incident infrared ray in present invention, as shown in FIG. 7B. In this way the front side wet etching windows are defined as narrow trenches.

The prior package of thermoelectric sensor comprises a metal can of four pins that two pins are the output for thermoelectric sensor and two pins are the electrodes for off-chip ambient temperature sensor. According to another embodiment of the present invention, a metal can package of the thermoelectric sensor with 5 pins or 6 pins are proposed. It means two pins for thermoelectric sensor, two pins for on chip temperature sensitive resistor, and two pins for the heater resistor, while the temperature sensitive resistor and heater resistor can share common ground electrode. The two pins of the thermoelectric sensor are isolated from the metal can to reduce the noise influence.

The features of the present invention are illustrated as follows:

(1) the structure of the second thermocouple element layer:

The second thermocouple element line provides a zigzag, or meander, structure to decrease thermal conductance, the material is made of the low thermal conductivity material such as titanium or titanium alloy. Based on this way, even using AlSiCu material of the standard CMOS process, the solid conductance still can be decreased up to 70%–80% compared to the prior straight line structure. In view of aforementioned reason, it can improve the sensor performance without increasing the size of the thermoelectric sensor and the cost.

Figure 4A:
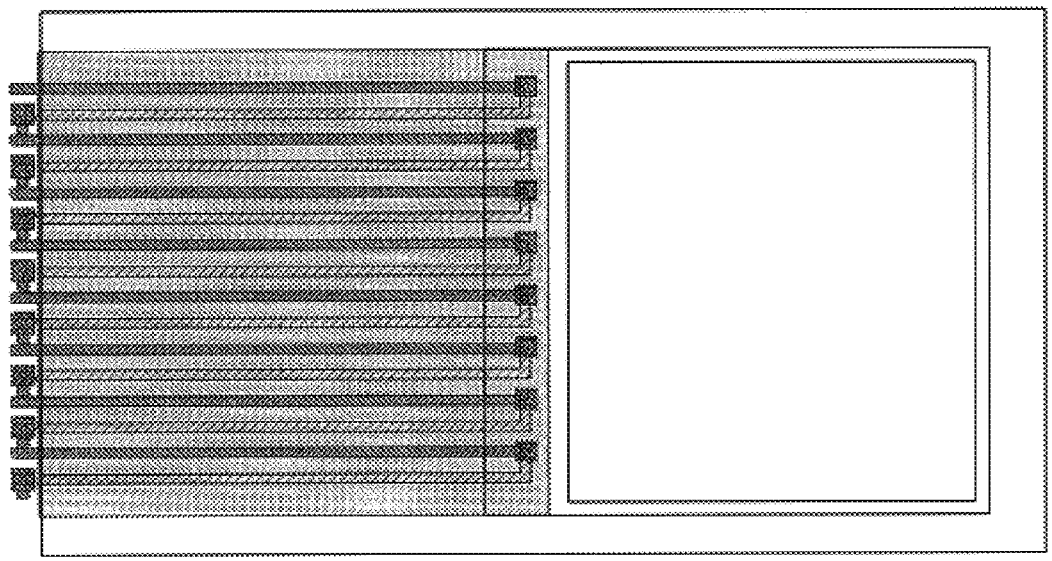
FIG. 4A shows the thermoelectric sensor structure of a cantilever beam in accordance with the embodiment of the present invention.
Figure 4B:
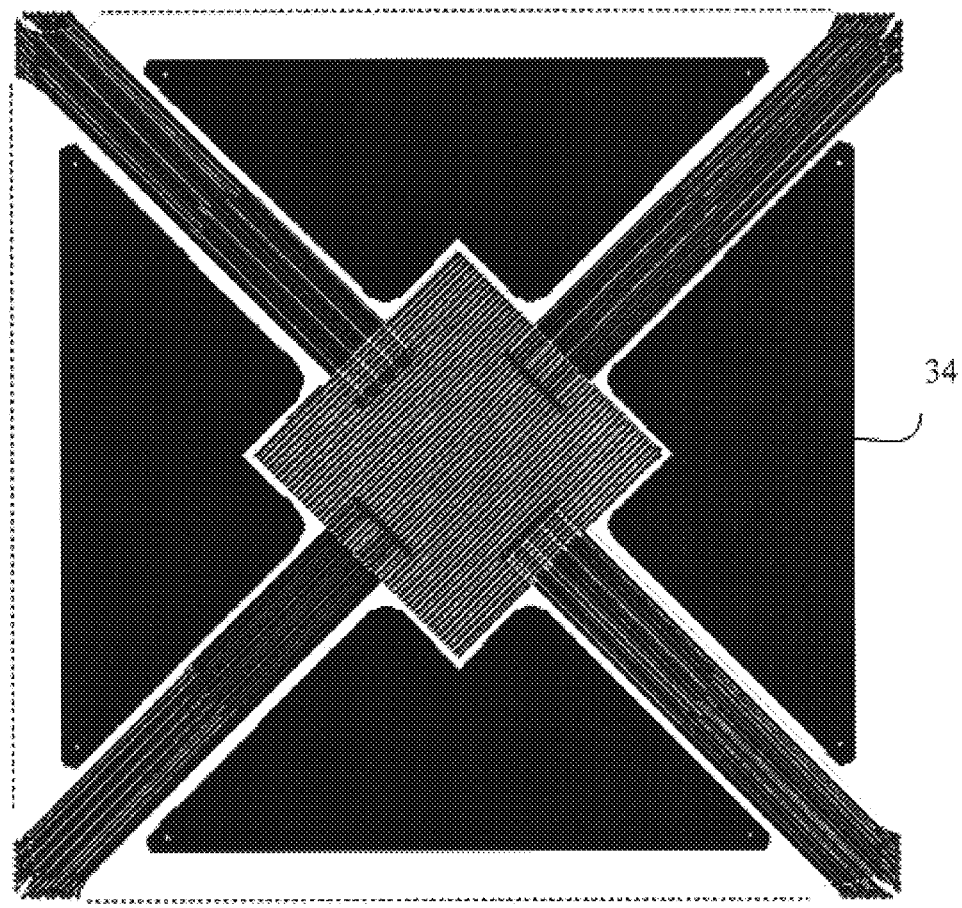
FIG. 4B shows the thermoelectric sensor structure of a 4-arm bridge in accordance with the embodiment of the present invention.
Figure 4C:
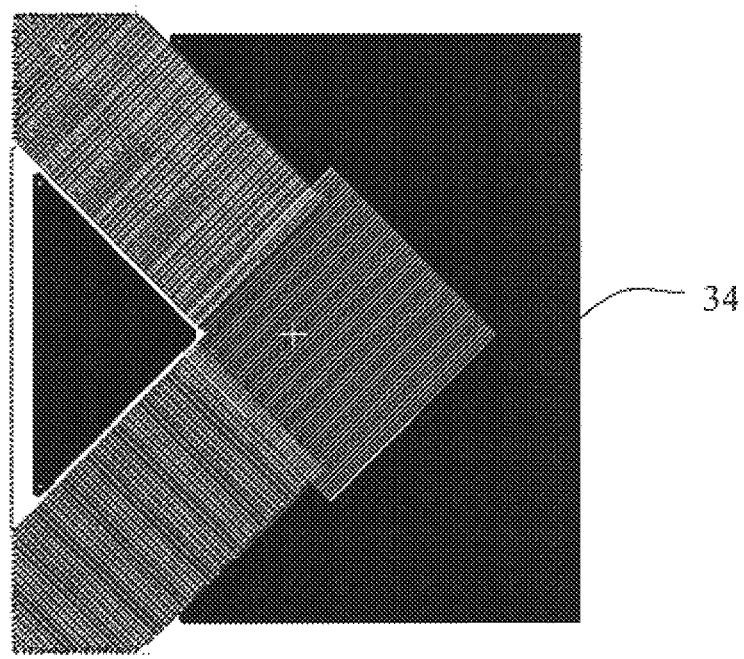
FIG. 4C shows the thermoelectric sensor structure of a 2-arm bridge in accordance with the embodiment of the present invention.

(2) The post-etching process:

The present invention provides the front side Si anisotropic wet etching technique to substitute for the traditional back side Si anisotropic wet etching technique. The device size of the thermoelectric sensor can be reduced when the front side wet etching is applied to release the thermocouple and radiation absorber structure. This way will increase the gross die of a wafer, and decrease the wet etching time. The relative structures can be a cantilever beam, 2-arm bridge, and 4-arm bridge, as shown in FIGS. 4A, 4B, and 4C.

(3) The radiation absorber:

The preferred embodiment of the present invention can employ titanium and its relative alloy to be a radiation absorber layer 39. The optimum absorptivity is obtained by controlling suitable thickness around 34 $\mu g/cm^2$. It is helpful that titanium is an available material in the standard CMOS process.

Figure 5:
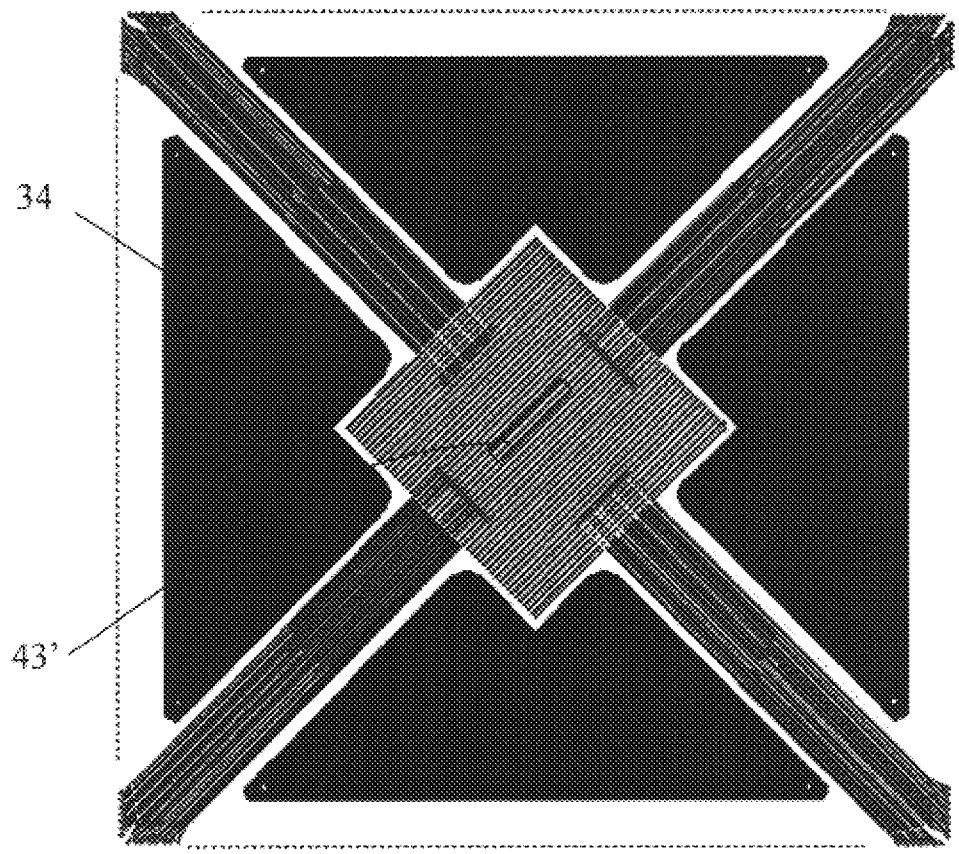
FIG. 5 shows the thermoelectric sensor structure with wet etching hole on radiation absorber layer in accordance with the embodiment of the present invention.

(3) The etching hole:

It is easy to obtain a hillock structure on the bottom of v-grove after the front side wet etching treatment, when the membrane area of radiation absorber layer is enlarged. An etching hole 43' like the etching window 34 can be etched on the center of radiation absorber membrane, as shown in FIG. 5. The function of this etching hole 43' is not only to avoid formation of a silicon hill on the bottom, but also to shorten the etching time.

Figure 6:
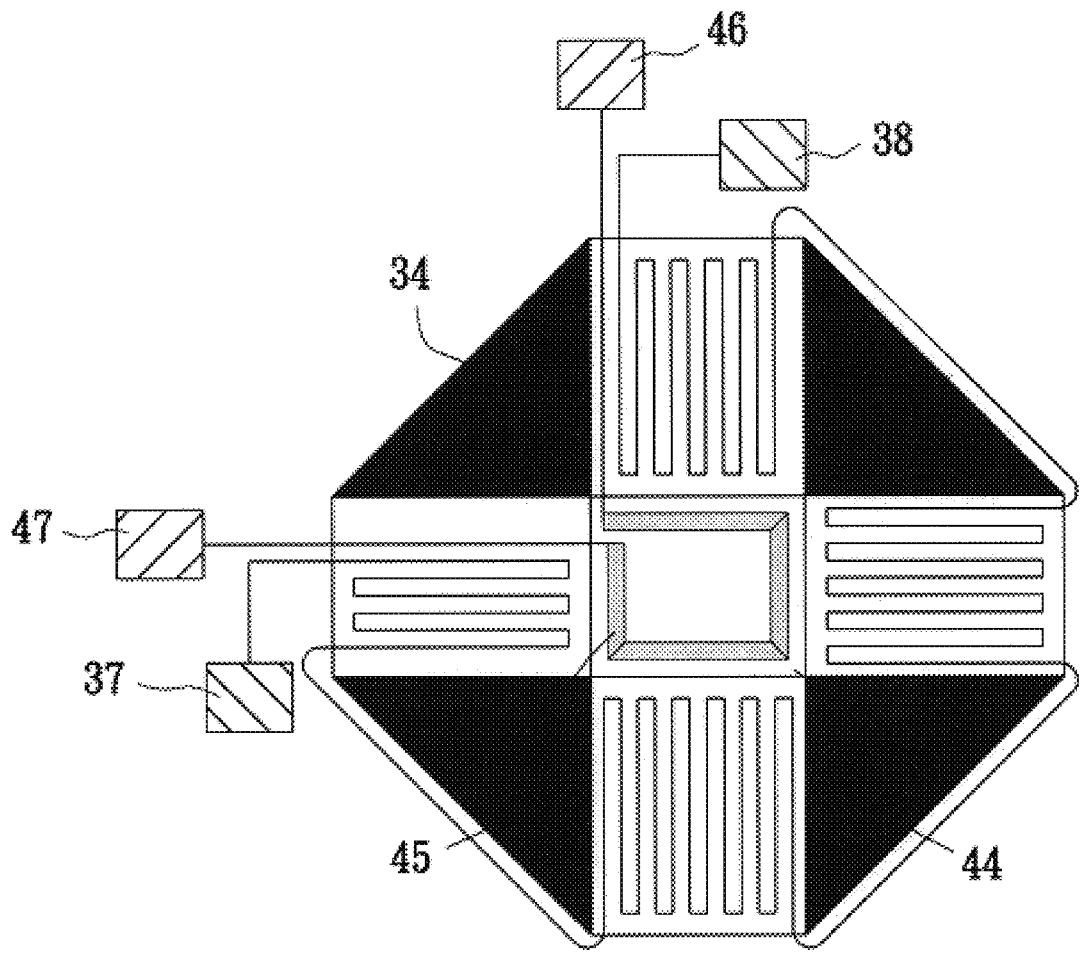
FIG. 6 shows the schematic by fabricating a heater resistor on the neighboring area of hot junction of a thermocouple membrane used for electrical calibration in accordance with another embodiment of the present invention.

(5) The structure of performing electrical calibration measurement:

The present invention provides a resistor 45 on the radiation absorber membrane 44, the resistor 45 is electrically coupled to the third metal pad 46, and the fourth metal pad 47 as depicted in FIG. 6. The material of the resistance 45 is made from the material of the first thermocouple element layer or second thermocouple element layer. The input power between the third metal pad 46 and the fourth metal pad 47 is supplied to electrical calibration measurement. The value of incident power and the rising temperature of thermoelectric sensor are simulated by and in proportional to the input heat power of the heater resistor and induced temperature rising of the thermoelectric sensor.

(6) The process:

The present invention provides a compatible CMOS process, and achieves the process combine with CMOS, BiCMOS and thermoelectric sensor, and reduces the noise effect of the miscellaneous circuit. It is helpful to simplify the process.

(7) The temperature sensitive resistor for the measurement of ambient temperature:

The general thermoelectric sensor measures the ambient temperature by using an off-chip temperature sensor. The present invention applies the same-material with the first thermocouple element line or the second thermocouple element line to form an on-chip temperature sensitive resistor that can be used to measure the ambient temperature. Besides, to avoid rising temperature of silicon substrate due to the dissipated heat power from the bias reading of this on-chip temperature sensitive resistor, the resistance of this on-chip resistor is designed to be greater than 100 K$\Omega$.

(8) The reflective mirrors structure:

The reflective mirrors comprising the first metal and/or second metal are used to reflect the incident infrared ray in the present invention to avoid secondary incident infrared ray radiates onto the back side of the radiation absorber layer of the thermoelectric structure.

(9) The package of the thermoelectric sensor provides 5 pins or 6 pins of metal can:

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of manufacturing a thermoelectric sensor comprising:

providing a silicon substrate;

depositing a first isolation layer on a surface of the silicon substrate;

depositing a material layer on a surface of the first isolation layer;

patterning and etching the part of a material layer to form a first thermocouple element line;

depositing a second isolation layer on a surface of the first thermocouple element line and the first isolation layer;

patterning part of the second isolation layer to form a plurality of contact windows;

depositing a first metal layer on a surface of the second isolation layer;

patterning and etching part of the first metal layer to form a second thermocouple element line, and the second thermocouple element line being in contact with the first thermocouple element line by a plurality of hot junctions and cold junctions which permeate the contact windows;

depositing a third isolation layer on the surface of the second thermocouple element line and the second isolation layer;

etching part of the third isolation layer and the second isolation layer, a last part of the second thermocouple element line being exposed to thereby be coupled electrically to a second metal pad, and a first part of the first thermocouple element line being electrically coupled to a first metal pad by the second thermocouple element line;

depositing a second metal layer above the third isolation layer;

etching part of the second metal layer and forming the first metal pad and second metal pad;

depositing a fourth isolation layer above the third isolation and the second metal layer;

depositing a third metal layer above the fourth isolation layer, and defining a radiation absorber layer by, etching or lifting off to thereby enable absorption of infrared rays;

depositing a fifth isolation layer on a surface of the fourth isolation layer and the radiation absorber layer;

etching part of the fourth isolation layer and the fifth isolation layer, and forming a front side wet etching window with the first metal pad and the second metal pad being exposed;

forming etching windows and a hole, passing through the fifth isolation layer, the fourth isolation layer, the third isolation layer, the second isolation layer, and the first isolation layer to expose a surface of the silicon substrate; and etching the silicon substrate via the etching hole by a front side silicon anisotropic wet etching technique to thereby undercut the silicon substrate.

2. The method of claim 1, wherein material of the thermocouple element material layer comprises metal and polysilicon.

3. The method of claim 1, wherein radiation absorber layer material is selected from the group consisting of titanium, titanium nitride, titanium alloy, and other alloy.

4. The method of claim 1, wherein material of the first thermocouple element line and the second thermocouple element line comprise semiconductor material.

5. The method of claim 1, wherein the first thermocouple element line coupled to the second thermocouple element line with the third metal layer.

6. The method of claim 1, wherein material of the second thermocouple element line is selected from the group consisting of titanium, aluminum, titanium nitride, titanium alloy, and aluminum alloy, and relative mixtures.

7. The method of claim 1, wherein zigzag structure of the second thermocouple element line can be single zigzag layer structure, a multi-layer zigzag structure, a sinuous shape structure or other structure shapes.

8. The method of claim 1, wherein the first metal pad and the second metal pad are made by the first metal layer.

9. The method of claim 1, wherein an etching hole on the center of the radiation absorber membrane is formed while the etching windows are formed.

10. A thermoelectric sensor device in which an output of the thermoelectric sensor device makes use of a first metal pad and second metal pad, comprising:

a silicon substrate;

a first isolation layer formed on a surface of the silicon substrate;

a plurality of first thermocouple element lines formed on a surface of the first isolation layer, wherein each of the first thermocouple element lines have a hot junction and a cold junction, and the cold junction of the first thermocouple element lines is electrically coupled to the first metal pad;

a second isolation layer formed on a surface of the first thermocouple element line;

a plurality of second thermocouple element lines formed on a surface of the second isolation layer, wherein the second thermocouple element lines have a zigzag structure, wherein each of the second thermocouple element lines have a hot junction and a cold junction, the hot junction of the second thermocouple element line connects with the hot junction of the first thermocouple element line, and a last cold junction of the second thermocouple element lines is electrically coupled to the second metal pad;

a third isolation layer formed on the surface of the second isolation layer and the second thermocouple element line;

a second metal layer formed on the first metal pad and the second metal pad;

a fourth isolation layer formed on a surface of the third isolation layer, the first metal pad, and the second metal pad;

a radiation absorber layer formed on a part of a surface of the fourth isolation layer for absorbing infrared rays;

a fifth isolation layer formed on a surface of the fourth isolation layer and the radiation absorber layer;

a bonding pad window formed above the first metal pad and the second metal pad and passing through the fifth isolation layer and the fourth isolation layer, and the surface of the first metal pad and the second metal pad being exposed; and etching windows formed on a surface of the fifth isolation layer and extending downward and passing through the fifth isolation layer, the fourth isolation layer, the third isolation layer, and the second isolation for communicating the silicon substrate with an external connection.

11. The device of claim 10, wherein the silicon substrate comprise Complementary Metal-Oxide-Semiconductor (CMOS) circuit.

12. The device of claim 10, wherein the silicon substrate comprise Bipolar Complementary Metal-Oxide-Semiconductor (BiCMOS) circuit.

13. The device of claim 10, wherein the thermoelectric sensor device is a cantilever beam.

14. The device of claim 10, wherein the thermoelectric sensor device is a 4-arm bridge.

15. The device of claim 10, wherein the first thermocouple element line has a straight line or zigzag structure.

16. The device of claim 10, wherein the second thermocouple element line has a zigzag structure.

17. The device of claim 10, further comprising a temperature sensitive resistor selected from the group consisting of the first thermocouple element line and the second thermocouple element line, and having a resistance greater than 100 K$\Omega$.

18. The device of claim 10, wherein a heater resister performs electrical calibration measurement, and the heater resister is made on the radiation absorber membrane in a neighboring area of the hot junction.

19. The device of claim 18, wherein the material of the resister is made from the material of the first thermocouple element layer or second thermocouple element layer.

20. The device of claim 10, further comprising 5 pins of metal can.

21. The device of claim 10, further comprising 6 pins of metal can.

22. The device of claim 10, wherein etching windows are defined as narrow trenches, reflective mirrors comprising the first metal and/or second metal layers are used to reflect the incident infrared ray to avoid secondary incident infrared ray radiates onto the back side of the radiation absorber layer of the thermoelectric sensor structure.

23. A thermoelectric sensor made in accordance with the method of claim 1.

* * * * *